(12) United States Patent
Fukumoto

(10) Patent No.: US 7,692,304 B2
(45) Date of Patent: Apr. 6, 2010

(54) SEMICONDUCTOR DEVICE HAVING A TAPERED PLUG

(75) Inventor: Yasutaka Fukumoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 44 days.

(21) Appl. No.: 12/010,077

(22) Filed: Jan. 18, 2008

(65) Prior Publication Data

US 2008/0258310 A1  Oct. 23, 2008

(30) Foreign Application Priority Data

Jan. 22, 2007 (JP) .............................. 2007-010979

(51) Int. Cl.
*H01L 23/48* (2006.01)
(52) U.S. Cl. .................. 257/758; 257/760; 257/775; 257/E23.145
(58) Field of Classification Search ............... 257/758, 257/760, 774, 775, E23.145
See application file for complete search history.

(56) References Cited

U.S. PATENT DOCUMENTS

| | | | | |
|---|---|---|---|---|
| 4,439,270 | A | * | 3/1984 | Powell et al. ............... 438/701 |
| 5,940,731 | A | * | 8/1999 | Wu ............................. 438/640 |
| 6,215,187 | B1 | * | 4/2001 | Ooto et al. .................. 257/758 |
| 7,084,508 | B2 | * | 8/2006 | Eimori ....................... 257/774 |
| 2007/0018243 | A1 | * | 1/2007 | Ono et al. ................... 257/330 |
| 2007/0262464 | A1 | * | 11/2007 | Watkins et al. .............. 257/774 |

FOREIGN PATENT DOCUMENTS

JP  10-270555  10/1998

\* cited by examiner

*Primary Examiner*—Tuan N. Quach
(74) *Attorney, Agent, or Firm*—McGinn IP Law Group, PLLC

(57) ABSTRACT

A semiconductor device includes: first and second interlayer dielectric films consecutively deposited to overlie a silicon substrate; contact plugs penetrating the first interlayer dielectric film and having a top surface located within the second interlayer dielectric film; and via-plugs having a first portion, the diameter of which reduces from the top of the second interlevel dielectric film toward the bottom thereof and a second portion extending between the first portion and the first plug, the second portion having a diameter increasing from the first portion to the first plug.

20 Claims, 3 Drawing Sheets

SEMICONDUCTOR DEVICE HAVING A TAPERED PLUG

This application is based upon and claims the benefit of priority from Japanese patent application No. 2007-010979, the disclosure of which is incorporated herein in its entirety by reference.

BACKGROUND OF THE INVENTION

1. Field of the Invention

The present invention relates to a semiconductor device and a method of manufacturing the semiconductor device, and more particularly to the structure of a plug in the semiconductor device and a method of forming the plug.

2. Description of the Related Art

A DRAM (Dynamic Random Access Memory) device includes an array of memory cells for storing therein data. Each memory cell includes a MISFET (Metal Insulator Semiconductor Field Effect Transistor) formed on the surface portion of a semiconductor substrate and a cell capacitor overlying the semiconductor substrate and connected to the MISFET through a plug. The memory cell accumulates charge in the cell capacitor via the MISFET to thereby store therein data.

In manufacture of the DRAM device, the MISFETs are first formed on the surface portion of the semiconductor substrate and then an interlayer dielectric film is deposited to cover the semiconductor substrate and MISFETs. Contact holes are then formed to penetrate the interlayer dielectric film to expose therethrough source/drain diffused regions of the MISFETs. Thereafter, a conductive material or materials are embedded within the contact holes to form therein contact plugs. Further, bit lines and cell capacitors are formed to overlie the interlayer dielectric film, and connected to the contact plugs directly or through via-plugs. A plurality of interlayer dielectric films as well as a plurality of conducting layers including the contact plugs and via-plugs are stacked one on another to form a multilayer interconnection structure.

In recent years, to meet the demand on higher integration of DRAM devices, the area in which the memory cell occupies on the semiconductor substrate has been drastically reduced, with the result that the space between adjacent plugs has been significantly reduced. Therefore, the positional accuracy of the plugs has been improved and the diameter of the plugs is reduced in the recent DRAM devices, to thereby prevent a short-circuit failure from occurring between the plugs. Meanwhile, in a dry etching process for forming the contact holes and via-holes (hereinafter referred to as collectively via-holes), it is noted that the etching performance is degraded if the depth of via-holes being etched is increased, with the result that the plugs have a smaller diameter at the position of a larger depth, whereby the via-holes have a tapered structure. The tapered via-plugs decrease the contact area between the tapered via-plugs and the underlying plugs, thereby causing the problem of increase in the contact resistance therebetween.

To solve the aforementioned problem, Patent Publication JP-1998-270555A1 describes a technique for enlarging the contact area between the via-plugs and the underlying conductive layer by increasing the diameter in the vicinity of the bottom of the via-holes. In the technique of the JP-1998-270555A1, an interlayer dielectric film receiving therein via-plugs has a two-layer structure, wherein the etch rate of the lower interlayer dielectric layer is higher than that of the upper interlayer dielectric layer. Via-holes penetrating the interlayer dielectric layers are formed by a dry etching process, and then the lower interlayer dielectric layer is selectively etched by a wet etching process to enlarge the diameter in the vicinity of the bottom of the via-holes.

The technique described in JP-1998-270555A1 is such that both the upper and lower interlayer dielectric layers are made of silicon oxide doped with impurities. The impurity concentration of the lower interlayer dielectric layer is higher than that of the upper interlayer dielectric layer, thereby allowing the etch rate of the lower interlayer dielectric layer to be higher than that of the upper interlayer dielectric layer.

The contact area between the plugs and the underlying conductive layer is enlarged by increasing the diameter in the vicinity of the bottom of the via-holes so as to suppress an increase in the contact resistance between the plugs and the underlying conductive layer. However, the method described in the above patent publication has a problem in that the diameter in the vicinity of the bottom the via-holes is difficult to control during the wet etching process performed for increasing the diameter. An excessively larger diameter of the via-plugs in the vicinity of the bottom thereof may cause a short-circuit failure between adjacent interconnections in the underlying conductive layer.

SUMMARY OF THE INVENTION

In view of the above circumstances in the conventional technique, it is an object of the present invention to provide a semiconductor device in which the contact area between a conductive plug belonging to an interconnection layer and another conductive plug belonging to the underlying conductive layer is increased while preventing a short-circuit failure between adjacent interconnections in the underlying conductive layer.

It is another object of the present invention to provide a method for manufacturing such a semiconductor device.

The present invention provides a semiconductor device including: first and second interlayer dielectric films consecutively deposited to overlie a semiconductor substrate; a first plug penetrating the first interlayer dielectric film and having a top surface located within the second interlayer dielectric film; and a second plug formed within the second interlevel dielectric film, the second plug including a first portion having a diameter reducing from a top surface of the second interlevel dielectric film toward a bottom thereof and a second portion extending between the first portion and the first plug, the second portion having a diameter increasing from the first portion toward the first plug.

The present invention also provides a method of manufacturing a semiconductor device including: forming a first plug having a top portion protruding upward from a first interlayer dielectric film overlying a semiconductor substrate; forming, on a top surface of the first plug, a top insulating film having a substantially conical shape and a bottom surface that has an area equal to or narrower than an area of the top surface of the first plug, by using a deposition process in association with a sputtering process; forming a second interlayer dielectric film on the first interlayer dielectric film, the first plug and the top insulating film; selectively etching the second interlayer dielectric film and the top insulating film by using an anisotropic etching process, to thereby form a via-hole having a bottom, a diameter of which is smaller than a diameter of a bottom of the top insulating film, by using an anisotropic etching process; removing the top insulating film which is formed adjacent to the via-hole by using an isotropic etching process to enlarge a diameter of a portion of the via-hole in a vicinity of the top surface of the first plug; and forming a second plug in the via-hole in contact with the first plug.

The above and other objects, features and advantages of the present invention will be more apparent from the following description, referring to the accompanying drawings.

DETAILED DESCRIPTION OF THE INVENTION

Figure 1:
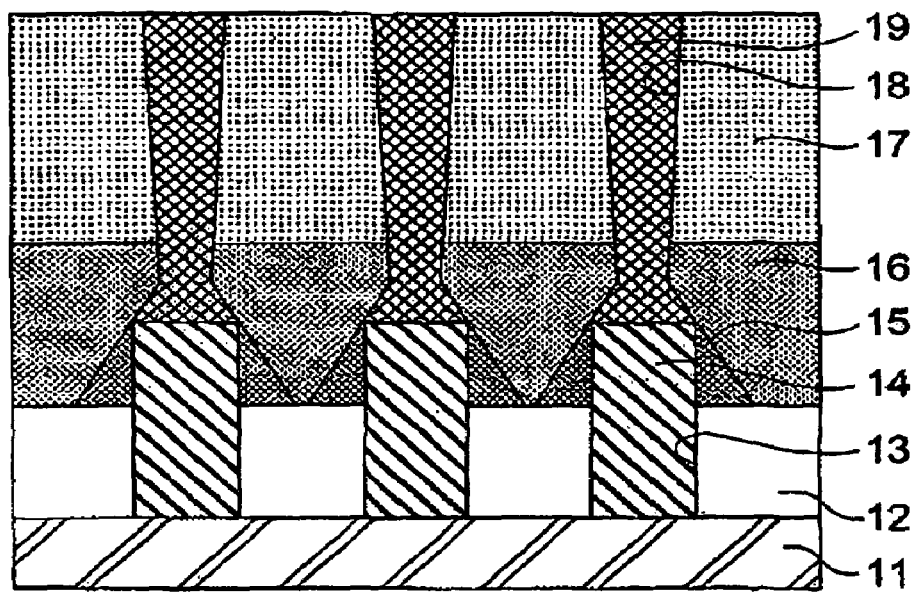
FIG. 1 is a sectional view showing the structure of a semiconductor device according to an embodiment of the present invention.

Hereinafter, an exemplary embodiment of the present invention will be described with reference to the accompanying drawings. FIG. 1 is a sectional view showing the structure of a semiconductor device according to the embodiment of the present invention. The semiconductor device 10 is a DRAM device, which includes a silicon substrate 11, on the surface portion of which there are provided MISFETs not shown in the figure.

A first interlayer dielectric film 12 including non-doped silicon oxide is formed to overlie the silicon substrate 11 and MISFETs. Contact holes 13 which penetrate the first interlayer dielectric film 12 expose therethrough source/drain regions of the MISFETs formed on the surface of the silicon substrate 11. Contact plugs 14 including a conductive material fill the internal space of the contact holes 13. The contact plugs 14 protrude upward from the top of the first interlayer dielectric film 12.

A sidewall insulating film 15 having an outer surface substantially of a truncated cone is formed on the top surface of the first interlayer dielectric film 12 and around the side surface of the contact plugs 14. A second interlayer dielectric film 16 is formed on the first interlayer dielectric film 12, contact plugs 14 and sidewall insulating film 15. The sidewall insulating film 15 is interposed between the contact plugs 14 and the second interlevel dielectric film 16. Thus, the sidewall insulating film 15 has an inner cylindrical surface in contact with the side surface of the contact plugs 14, an outer inclined side surface in contact with the second interlevel dielectric film 16, and a bottom flat surface in contact with the top surface of the first interlevel dielectric film 12. The sidewall insulating film 15 and second interlayer dielectric film 16 are made of silicon oxide doped with boron (B), phosphorous A) and fluorine (F). The concentration of B, P and F in the sidewall insulating film 15 is set to be higher Man that of B, P and F in the second interlayer dielectric film 16.

Via-holes 18 that penetrate the upper portion of the second interlayer dielectric film 16 expose therethrough the top surface of the contact plugs 14. Via-plugs 19 made of a conductive material fill the via-holes 18. On the second interlayer dielectric film 16, there are formed bit lines (not shown) connected to via-plugs other than the via-plugs 19 shown in FIG. 1. A third interlayer dielectric film 17 made of non-doped silicon oxide is formed on the second interlayer dielectric film 16 and bit lines. The third interlayer dielectric film 17 may be configured by silicon oxide doped with impurities, which has an impurity concentration significantly lower than the impurity concentration of the second interlayer dielectric film 16.

The via-holes 18 penetrate the third interlayer dielectric film 17 and the upper portion of second interlayer dielectric film 16, to expose therethrough the top surface of the contact plugs 14. The via-holes 18 have a tapered shape in which the diameter of the via-holes 18 are gradually reduced from the top surface of the third interlevel dielectric film 17 toward the bottom surface of the third interlayer dielectric film 17. The diameter of the via-holes 18 assumes a minimum at the location slightly lower than the top surface of the second interlayer dielectric film 16. The lower portion of the via-holes 18 below this location is such that the diameter of the via-holes 18 increases toward the top surface of the underlying contact plugs 14 so as to substantially expose the entire top surface of the contact plugs 14.

The via-plugs 19 are formed by filling the internal space of the via-holes 18 with a conductive material. The area of the bottom surface of the via-plugs 19 almost matches with that of the top surface of the contact plugs 14. Capacitors (not shown) overlie the third interlayer dielectric film 17 and have a bottom electrode in contact with the top surface of the via-plugs 19.

In the semiconductor device 10 of the present embodiment, as described above, the via-plugs 19 are such that the diameter of the upper portion of the via-plugs 19 gradually increases toward the top surface of the contact plugs 14 from the interface between the upper portion and the lower portion of the via-plugs 19, which is located at the location slightly below the top surface of the second interlayer dielectric film 16, and such that the area of the lower portion of the via-plugs 19 increases toward the bottom of the via-plugs 19 from the interface. The area of the bottom surface of the via-plugs 19 is substantially same as that of the top surface of the contact plugs 14. This structure results in an effective enlargement of the contact area between the contact plugs 14 and the via-plugs 19 while preventing a short-circuit failure between adjacent interconnections in the underlying conductive layer.

FIGS. 2A through 2F are sectional views showing consecutive steps of a process for manufacturing the semiconductor device 10 of FIG. 1. MISFETs are formed on the surface portion of the silicon substrate 11 before the first interlayer dielectric film 12 is deposited over the silicon substrate 11 and MISFETs. Subsequently, using a photolithographic technique, the contact holes 13 which penetrate the first interlayer dielectric film 12 are formed so as to expose therethrough the source/drain regions of the MISFETs on the silicon substrate 11. Then, the contact holes 13 are filled with a conductive material to form the contact plugs 14, to thereby obtain the structure shown in FIG. 2A.

Figure 2A:
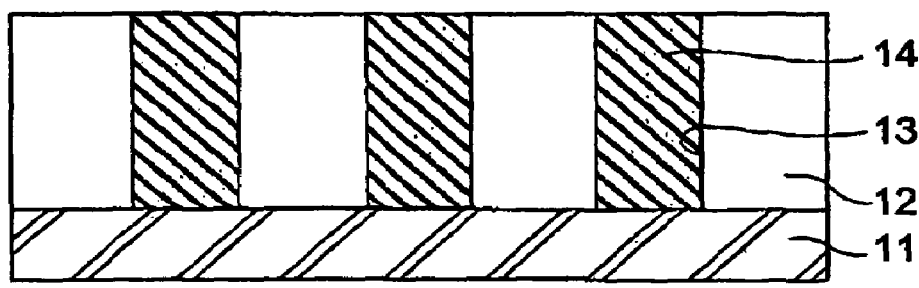
FIGS. 2A to 2F are sectional views showing consecutive steps of a process for manufacturing the semiconductor device of FIG. 1.
Figure 2B:
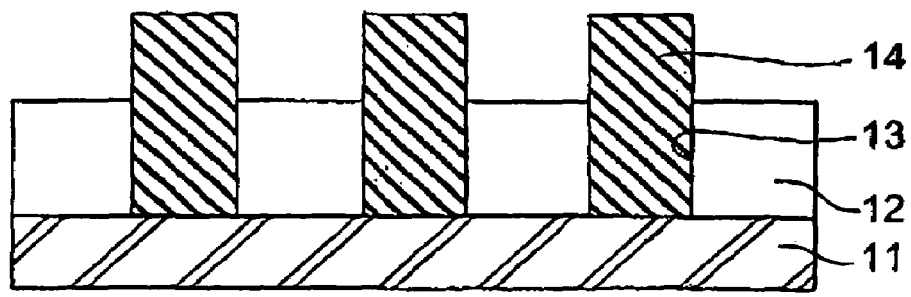
Figure 2C:
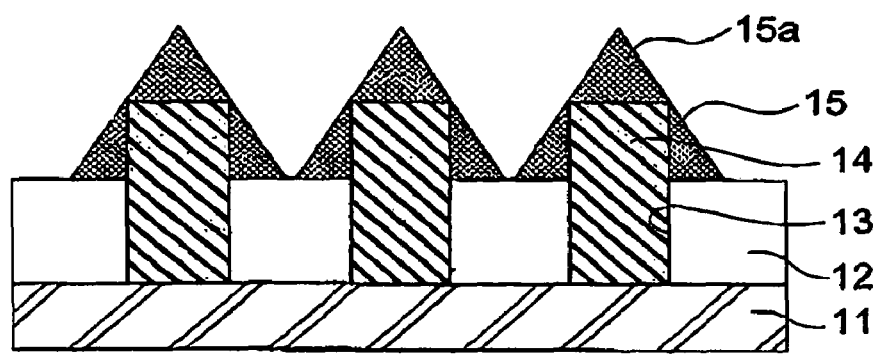

Thereafter, using a dry etching technique, the upper portion of the first interlayer dielectric film 12 is etched back to allow the upper portion of the contact plugs 14 to protrude from the thus exposed top surface of the first interlayer dielectric film 12, as shown in FIG. 2B. Subsequently, using a sputter deposition technique, an overcoat insulation film made of silicon oxide doped with B, P and F is deposited to form a conical shape, so as to completely cover the top and side surfaces of the contact plugs 14, as shown in FIG. 2C. The overcoat insulation film has a conical shape and includes a top insulating film 15a covering the top surface of the contact plugs 14, and a sidewall insulation film 15 covering the side surface of the contact plugs 14.

In the sputter deposition technique, a sputter deposition process and a sputter etching process are developed in parallel with each other. On the surface portion of the overcoat insulation film which is perpendicular to the sputtering direction, the etching rate exceeds the deposition rate. On the other hand, on the surface portion of the overcoat insulation film which has a crossing angle smaller than 90 degrees with respect to the sputtering direction, the deposition rate exceeds the etching Me. Thus, the overcoat insulation film can be selectively formed on the top and side surfaces of the contact plugs 14, to configure the top insulating film 15a and the sidewall insulating film 15.

In the sputter deposition technique, the bias power, frequency and the like of the power source unit for the deposition are adjusted to control the balance of the deposition rate and the etching rate so that the overcoat insulation film is deposited in such a manner that the bottom surface of the top insulating film 15a of the overcoat insulation film has a slightly narrower area than the top surface of the contact plugs 14. Thus, in the overcoat insulation film, the top insulating film 15a which covers the top surface of the contact plugs 14 and the sidewall insulating film 15 which covers the side surface of the contact plugs 14 are separated from each other by the edge of the top surface of the contact plugs 14. It is to be noted that the etch-back process by which the upper portion of the contact plugs 14 is allowed to protrude upward from the first interlayer dielectric film 12 may be performed using a wet etching technique instead.

The second interlayer dielectric film 16 made of silicon oxide doped with B, P and F is deposited over the first interlayer dielectric film 12 and overcoat insulation film. In this example, the concentrations of B and P in the overcoat insulation film may be 11.0 molar percents and 4.7 molar percents, respectively, whereas the concentrations of B and P in the second interlayer dielectric film 16 may be 7.0 molar percents and 3.5 molar percents, respectively.

Although not shown in the figure, a photoresist pattern having substantially circular openings is then formed on the second interlayer dielectric film 16 and the overcoat insulation film. A dry etching process using the photoresist pattern as a mask is conducted to form via-holes which expose therethrough the top portion of the contact plugs other than the contact plugs 14 shown in the drawings. After removing the photoresist pattern, a conductive material is embedded in the via-holes to form via-plugs not shown. Subsequently, the bit lines which are connected to the top of the via-plugs is formed on the second interlayer dielectric film 16.

Figure 2D:
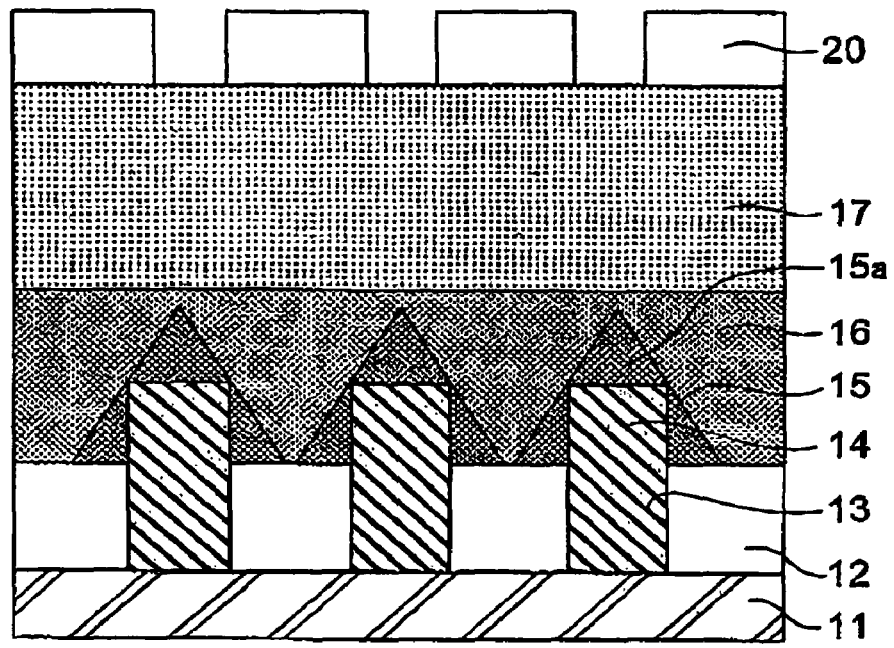

Thereafter, the third interlayer dielectric film 17 made of non-doped silicon oxide is deposited over the second interlayer dielectric film 16 and bit lines not shown. Subsequently, a photoresist pattern 20 having substantially circular openings is formed on the third interlayer dielectric film 17 as shown in FIG. 2D. Subsequently, a portion of the overcoat insulation film, i.e., top insulating film 15a, as well as the interlayer dielectric films 16, 17 are etched by a dry etching technique using the photoresist pattern 20 as a mask, to thereby form via-holes 18a exposing therethrough the top surface of the contact plugs 14.

Figure 2E:
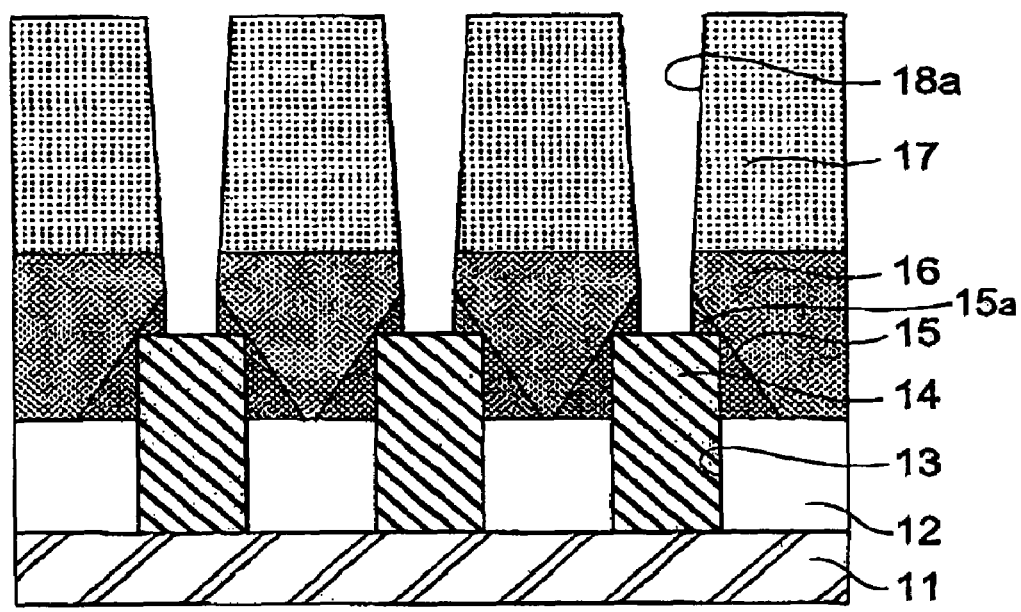

The dry etching process forming the via-holes 18a takes advantage of the difference in the impurity concentration between the second interlayer dielectric film 16 and the third interlayer dielectric film 17, and achieves an etch-selectivity wherein the etch rate of the second interlayer dielectric film 16 is higher than that of the third interlayer dielectric film 17. This prevents the diameter of the via-holes 18a in the vicinity of the lower portion thereof from being smaller than that in the vicinity of the upper portion thereof. Thereafter, the photoresist pattern 20 is removed as shown in FIG. 2E.

In the above dry etching process, a two-frequency RIE (Reactive Ion Etching) system is used which includes a bottom electrode configured by a susceptor on which the silicon substrate 11 is mounted and a top electrode overlying the bottom electrode to oppose the same. In the present embodiment, mixed gas including $C_4F_6$, $C_4F_8$, $C_5F_8$, $O_2$ and argon (Ar) is used as an etching gas, while employing a total gas pressure of 25 mTorr and a two-frequency RF power of 2500 W and 3000 W applied between the top electrode and the bottom electrode.

Figure 2F:
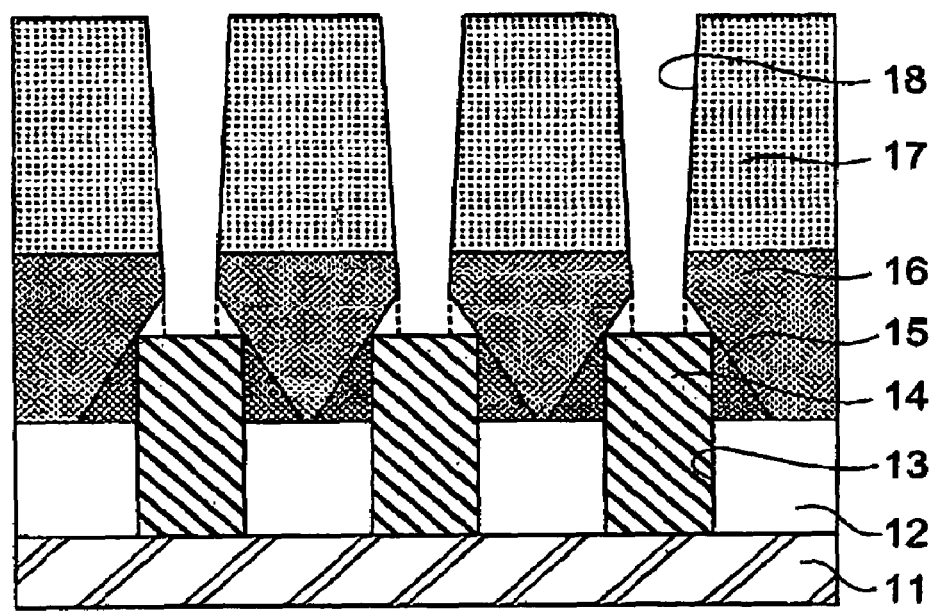

Subsequently, a wet etching process is performed taking advantage of the difference in the impurity concentration between the overcoat insulation film and the second interlayer dielectric film 16. The wet etching process is conducted under the condition of the etch selectivity wherein the etch rate of the overcoat insulation film is higher than that of the second interlayer dielectric film 16. Accordingly, the portion of the overcoat insulation film, i.e., the top insulating film 15a that is exposed within the via-holes 18a and deposited on the top surface of the contact plugs 14 is removed selectively from the second interlevel dielectric film 16. Thus, the resultant via-holes 18 have a larger diameter in the vicinity of the bottom portion than in the other portion of the via-holes 18a. After the wet etching process, the lower portion of the overcoat insulation film is left on the side surface of the contact plugs 14, to remain as the sidewall insulating film 15 in the final product, as shown in FIG. 2F.

In the above wet-etching process, the contact plugs 14 and second interlayer dielectric film 16 function as an etch stopper member. Thus, ingress of the etchant toward the side surface of the contact plugs 14 is prevented in the wet etching process, whereby the sidewall insulating film 15 on the side surface of the contact plugs 14 remains without being etched. It is to be noted that an isotropic dry etching process may be used instead of the wet etching process.

Thereafter, the via-holes 18 are filled with a conductive material to configure the via-plugs 19, as shown in FIG. 1. Subsequently, a known procedure, such as including the step of forming the capacitors having a bottom electrode in contact with the via-plugs 19 on the third interlayer dielectric film 17, is employed to manufacture the products of the semiconductor device 10.

In the method of manufacturing the semiconductor device according to the present embodiment, the wet etching process in which a portion of the overcoat insulation film, i.e, top insulating film 15a deposited on the top surface of the contact plugs 14 is selectively removed from the sidewall insulating film 15 provides the structure of the contact plugs 14 wherein the substantially entire top surface of the contact plugs 14 is exposed through the resultant via-holes 18. This provides the structure wherein the diameter of the via-holes 18 increases toward the top thereof and toward the bottom thereof from a specific position, which is located in the vicinity of the top surface of the contact plugs 14, and wherein the via-plugs 19 have a bottom surface having an area substantially matching the area of the top surface of the contact plugs 14.

In the above wet etching process, the contact plugs 14 and second interlayer dielectric film 16 function as an etch stopper member. Thus, it is possible to prevent the etched portion from extending toward the side surface of the contact plugs 14, thereby enabling an effective control of the diameter of the via-plugs 19.

While the invention has been particularly shown and described with reference to exemplary embodiment and modifications thereof, the invention is not limited to these embodiment and modifications. It will be understood by those of ordinary skill in the art that various changes in form and details may be made therein without departing from the spirit and scope of the present invention as defined in the claims.

What is claimed is:

1. A semiconductor device, comprising:
   first and second interlayer dielectric films consecutively deposited to overlie a semiconductor substrate;

a first plug penetrating said first interlayer dielectric film and having a top surface located within said second interlayer dielectric film; and a second plug formed within said second interlayer dielectric film, said second plug including a first portion having a diameter reducing from a top surface of said second interlayer dielectric film toward a bottom thereof and a second portion extending between said first portion and said first plug, said second portion having a diameter increasing from said first portion toward said first plug.

2. The semiconductor device according to claim 1, further comprising a third interlayer dielectric film formed on said second interlayer dielectric film, wherein said second plug has a third portion extending from said first portion and penetrating said third interlayer dielectric film, said third portion having a diameter increasing toward a top of said third portion.

3. The semiconductor device according to claim 1, further comprising a sidewall insulating film formed between said second interlayer dielectric film and a side surface of said first plug so as to cover said side surface of said first plug.

4. The semiconductor device according to claim 3, wherein said sidewall insulating film has an impurity concentration higher than an impurity concentration of said second interlayer dielectric film.

5. The semiconductor device according to claim 3, wherein said sidewall insulating film has an inner cylindrical surface in contact with the side surface of said first plug, a bottom surface in contact with said first interlayer dielectric film, and an outer inclined surface in contact with said second interlayer dielectric film.

6. The semiconductor device according to claim 3, wherein the sidewall insulating film is disposed inside the second interlayer dielectric film such that a bottom surface of the sidewall insulating film contacts the first interlayer dielectric film and a top edge of the sidewall insulating film contacts a top edge of the first plug and a bottom edge of the second plug.

7. The semiconductor device according to claim 3, wherein the sidewall insulating film is completely disposed inside the second interlayer dielectric film.

8. The semiconductor device according to claim 1, wherein the top surface of the first plug is located inside the second interlayer dielectric film above a top surface of the first interlayer dielectric film.

9. The semiconductor device according to claim 1, wherein the first plug penetrates inside the second interlayer dielectric film such that a height of the first plug is greater than a height of the first interlayer dielectric film.

10. The semiconductor device according to claim 1, wherein the first plug penetrates inside the second interlayer dielectric film with the same uniform width that the first plug extends through the first interlayer dielectric film.

11. The semiconductor device according to claim 1, wherein an area of a bottom surface of the second plug is equal to an area of the top surface of the first plug such that the bottom surface of the second plug coincides with the top surface of the first plug.

12. The semiconductor device according to claim 1, wherein the second portion connects edges of a bottom surface of the second plug to edges of the top surface of the first plug in an increasing inclined profile.

13. The semiconductor device according to claim 1, wherein the diameter of the second portion continuously increases, from an interface between the first portion and the second portion, toward the top surface of the first plug, the interface being located below the top surface of the second interlayer dielectric film and above a top surface of the first interlayer dielectric film.

14. The semiconductor device according to claim 1, wherein the second plug comprises a continuous solid plug, an internal space of the second plug, placed between side surfaces of the second plug, being filled with a same conductive material.

15. The semiconductor device according to claim 1, wherein the first and second portions of the second plug are integrally formed.

16. A semiconductor device, comprising:
a plug provided in an interlayer dielectric film, the plug including a first portion having a first diameter, a second portion formed above the first portion and having a second diameter, and a third portion, provided between the first portion and the second portion, having a third diameter, the first diameter being larger than the third diameter, and the second diameter being larger than the third diameter,
wherein the first diameter increases in a direction from the second portion toward a bottom of the first portion.

17. The semiconductor device according to claim 16, wherein the third portion forms an interface between the first portion and the second portion such that the diameter of the second portion continuously increases, from the interface, toward a top surface of the second plug, and the diameter of the first portion continuously increases, from the interface, toward a bottom of the interlayer dielectric film, the interface being located inside the interlayer dielectric film above the bottom of the interlayer dielectric film.

18. The semiconductor device according to claim 16, wherein the plug comprises a continuous solid plug, an internal space of the plug, placed between side surfaces of the plug, being filled with a same conductive material.

19. The semiconductor device according to claim 16, wherein the first, second, and third portions are integrally formed.

20. A semiconductor device, comprising:
first and second interlayer dielectric films consecutively deposited on a semiconductor substrate;
a first plug extending through the first interlayer dielectric film and penetrating the second interlayer dielectric film, a top surface of the first plug being located inside the second interlayer dielectric film above the first interlayer dielectric film; and
a second plug formed within the second interlayer dielectric film above the first interlayer dielectric film, the second plug comprising:
a conversion portion that extends from a top surface of the second interlayer dielectric film to an interface located within the second interlayer dielectric film; and
a divergence portion that extends continuously from the interface to side edges of the top surface of first plug.

* * * * *